(12) United States Patent
Kim et al.

(10) Patent No.: US 8,741,706 B2
(45) Date of Patent: Jun. 3, 2014

(54) HIGH ELECTRON MOBILITY TRANSISTOR AND METHOD OF MANUFACTURING THE SAME

(71) Applicants: Jun-youn Kim, Hwaseong-si (KR); Jae-won Lee, Seoul (KR); Hyo-ji Choi, Seoul (KR)

(72) Inventors: Jun-youn Kim, Hwaseong-si (KR); Jae-won Lee, Seoul (KR); Hyo-ji Choi, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 13/944,444

(22) Filed: Jul. 17, 2013

(65) Prior Publication Data
US 2013/0302953 A1    Nov. 14, 2013

Related U.S. Application Data

(63) Continuation of application No. 13/571,949, filed on Aug. 10, 2012, now Pat. No. 8,536,623.

(30) Foreign Application Priority Data

Sep. 29, 2011    (KR) ................ 10-2011-0099234

(51) Int. Cl.
*H01L 21/18*    (2006.01)
*H01L 21/302*    (2006.01)
*H01L 29/66*    (2006.01)

(52) U.S. Cl.
USPC .................. 438/172; 257/194; 257/E29.246

(58) Field of Classification Search
None
See application file for complete search history.

(56) References Cited

U.S. PATENT DOCUMENTS

| | | | |
|---|---|---|---|
| 6,967,122 B2 | 11/2005 | Tezen | |
| 7,052,979 B2 * | 5/2006 | Nagai et al. | 438/478 |
| 7,435,666 B2 * | 10/2008 | Park | 438/479 |
| 7,462,867 B2 | 12/2008 | Tezen | |
| 7,682,944 B2 | 3/2010 | Brandes et al. | |
| 8,063,467 B2 * | 11/2011 | Tischler | 257/496 |
| 2012/0007143 A1 * | 1/2012 | Kim et al. | 257/190 |
| 2013/0001587 A1 * | 1/2013 | Hwang et al. | 257/76 |

FOREIGN PATENT DOCUMENTS

| | | |
|---|---|---|
| KR | 10-2002-0047225 A | 6/2002 |
| KR | 10-2003-0074824 A | 9/2003 |
| KR | 10-2006-0019614 A | 3/2006 |
| KR | 10-2009-0029905 A | 3/2009 |
| WO | WO-01/27980 A1 | 4/2001 |

* cited by examiner

*Primary Examiner* — Thomas L Dickey
*Assistant Examiner* — Joseph Schoenholtz
(74) *Attorney, Agent, or Firm* — Harness, Dickey & Pierce, P.L.C.

(57) ABSTRACT

A high electron mobility transistor (HEMT) includes a substrate, an HEMT stack spaced apart from the substrate, and a pseudo-insulation layer (PIL) disposed between the substrate and the HEMT stack. The PIL layer includes at least two materials having different phases. The PIL layer defines an empty space that is wider at an intermediate portion than at an entrance of the empty space.

26 Claims, 17 Drawing Sheets

HIGH ELECTRON MOBILITY TRANSISTOR AND METHOD OF MANUFACTURING THE SAME

CROSS-REFERENCE TO RELATED APPLICATIONS

This application is a continuation application of U.S. application No. 13/571,949, filed Aug. 10, 2012, which claims priority under 35 U.S.C. §119 to Korean Patent Application No. 10-2011-0099234, filed on Sep. 29, 2011, in the Korean Intellectual Property Office. The disclosure of each of the above-referenced applications is incorporated herein in its entirety by reference.

BACKGROUND

1. Field

Example embodiments relate to a power device and a method of manufacturing the same, and more particularly, to a high electron mobility transistor (HEMT) capable of maintaining a high breakdown voltage and a method of manufacturing the high electron mobility transistor.

2. Description of the Related Art

High electron mobility transistors (HEMTs) are a type of power device. An HEMT includes a two-dimensional electron gas (2DEG) used as a carrier in a channel layer. Since the 2DEG is used as a carrier, a mobility of the HEMT may be much higher than that of a general transistor.

A HEMT may include a compound semiconductor having a wide band gap. Accordingly, a breakdown voltage of the HEMT may be higher than that of a general transistor.

The breakdown voltage of a HEMT may be increased in proportion to a thickness of a compound semiconductor layer including a 2DEG, for example, a GaN layer. Accordingly, the breakdown voltage of a HEMT may be increased by forming a thick GaN layer.

However, forming the thick GaN layer takes a long time, and thus productivity of the HEMT may be decreased.

Another method of increasing the breakdown voltage of the HEMT is removing a silicon substrate.

However, in this case, an additional subordinate process such as wafer bonding may be done, and furthermore difficulties may arise in forming an electrode.

SUMMARY

Example embodiments relate to a high electron mobility transistor (HEMT) capable of maintaining a high breakdown voltage.

Example embodiments relate to a method of manufacturing a HEMT.

Additional aspects will be set forth in part in the description which follows and, in part, will be apparent from the description, or may be learned by example embodiments.

According to example embodiments, a high electron mobility transistor (HEMT) includes a substrate; an HEMT stack spaced apart from the substrate; and a pseudo-insulation layer (PIL) layer between the substrate and the HEMT stack. The PIL layer includes at least two materials having different phases. The PIL layer defines an empty space that is wider at an intermediate portion than at an entrance of the empty space.

The at least two materials having different phases may include a solid material and a non-solid material.

The solid material may be a semiconductor material, and the non-solid material may be air.

The at least two materials having different phases may include a solid material, and the solid material may include a plurality of pillars spaced apart from one another.

The plurality of pillars may be one of oxide pillars and polysilicon pillars.

The oxide pillars may be one of single crystal silicon oxide pillars and polysilicon oxide pillars.

The at least two materials having different phases may include a non-solid material, the non-solid material may contact a part of the HEMT stack and a part of the substrate.

The part of the substrate may be below the source electrode and the drain electrode.

The part of the substrate may be under a portion of an upper surface of the HEMT stack that is between the source electrode and the drain electrode.

The HEMT stack may include: a buffer layer on the PIL layer; a first stack on the buffer layer and including a two-dimensional electron gas (2DEG); a second stack having a polarization greater than that of the first stack; and a source electrode, a drain electrode, and a gate that are on the second stack.

The buffer layer may include a first buffer layer and a second buffer layer that are sequentially stacked, and the first buffer layer may define a plurality of through holes.

The second buffer layer may include a compound semiconductor layer having one of a super lattice layer and an aluminum (Al) gradient distribution that varies according to a thickness of the second buffer layer.

The HEMT may include a P-type material layer between the gate and the second stack.

According to example embodiments, method of manufacturing a high electron mobility transistor (HEMT) includes forming a first part of an HEMT stack on a substrate; forming a pseudo-insulation layer (PIL) layer in the substrate; and forming a second part of the HEMT stack on the first part of the HEMT stack. The PIL layer includes at least two materials having different phases. The PIL layer defines an empty space that is wider at an intermediate portion than at an entrance of the empty space.

The etching of the parts of the substrate exposed by the plurality of holes may be performed until a plurality of pillars spaced apart from one another are formed in the PIL layer.

The method may further include changing the plurality of pillars into a plurality of polysilicon pillars.

The changing the plurality of pillars into polysilicon pillars may include ion-implanting impurities into the plurality of pillars.

The method may further include oxidizing the plurality of pillars into which the impurities are implanted.

The oxidizing the plurality of pillars into which the impurities are implanted may further include one of oxidizing the plurality of pillars before forming the second part of the HEMT stack, oxidizing the plurality of pillars after forming the second part of the HEMT stack, and oxidizing the plurality of pillars during the forming the second part of the HEMT stack.

The forming the plurality of holes in the first part of the HEMT stack may further include forming a mask for defining areas where the plurality of holes are to be formed in the first part of the HEMT stack, the mask being formed to contact the first part of the HEMT stack and to cover a part of the substrate not including the pillars, and etching a first portion of the first part of the HEMT stack around the mask.

The part of the substrate may be below the source electrode and the drain electrode.

The part of the substrate may be between the source electrode and the drain electrode.

The at least two materials having different phases may include a non-sold material, and the non-solid material may contact the first part of the HEMT stack and a part of the substrate.

The etching the parts of the substrate exposed the by plurality of holes of the first part of the HEMT stack may include forming grooves in the parts of the substrate exposed by the plurality of holes, and expanding the grooves so as to have a diameter greater than that of the plurality of holes until the plurality of pillars spaced apart from one another are formed in the PIL layer.

The forming the grooves in the substrate may further include dry-etching the parts of the substrate exposed by the holes.

The expanding of the grooves may further include wet-etching the substrate in which the grooves are formed.

The plurality of pillars may be one of oxidized before the forming the second part of the HEMT stack, oxidized after the forming the second part of the HEMT stack, and oxidized during the forming the second part of the HEMT stack.

The forming the second part of the HEMT stack may include: forming a buffer layer covering the plurality of holes of the first part of the HEMT stack; forming a first stack comprising a 2DEG on the buffer layer; forming a second stack having a polarization greater than that of the first stack on the first stack; and forming a second electrode, a drain electrode, and a gate on the second stack. The source electrode, drain electrode, and the gate may be spaced apart from one another.

One of a recess and an oxide may be formed in an area below the gate of the second stack.

The buffer layer covering the plurality of holes of the first part of the HEMT stack may include a compound semiconductor layer having an aluminum (Al) gradient distribution.

The buffer layer covering the plurality of holes of the first part of the HEMT stack may include a super lattice layer.

The forming of the source electrode, the drain electrode, and the gate may include: forming a source electrode pad and a drain electrode pad spaced apart from each other on the second stack; forming a P-type material layer spaced apart from the source electrode pad and the drain electrode pad on the second stack between the source electrode pad and the drain electrode pad; forming the gate on the P-type material layer; forming an insulating layer covering the source electrode pad, the drain electrode pad, the P-type material layer, and the gate on the second stack; and forming the source electrode and the drain electrode respectively connected to the source electrode pad and the drain electrode pad.

The at least two materials having different phases may include a solid material and a non-solid material.

The solid material may be a semiconductor material and the non-solid material may be air.

The solid material may be an oxide.

The oxide may be one of oxides formed before the forming the second part of the HEMT stack, formed after forming the second part of the HEMT stack, and formed during the forming the second part of the HEMT stack.

The first part of the HEMT stack may be a first buffer layer.

According to example embodiments, a high electron mobility transistor (HEMT) may include a substrate, a pseudo-insulation layer (PIL) including a plurality of pillars that are arranged part from each other on the substrate, and a HEMT stack on the PIL layer. The PIL layer may define at least one empty space that is wider at an intermediate portion than at a top of the empty space.

At least one empty space of the PIL layer may be filled with air.

The plurality of pillars of the PIL layer may be one of single crystal silicon pillars, polysilicon pillars, and oxide pillars.

The PIL layer may define a plurality of empty spaces. The HEMT stack may include a first buffer layer on the PIL layer. The first buffer layer may define a plurality of through-holes. Each of the through-holes of the first buffer layer may overlay one of the plurality of empty spaces of the PIL layer. The HEMT stack may further include a semiconductor stack on the first buffer layer. The semiconductor stack may extend horizontally over the plurality of through-holes of the first buffer layer.

An average width of the plurality of through-holes of the first buffer layer may be less than an average width of the intermediate portions of the empty spaces of the PIL layer.

A second buffer layer may be disposed between the semiconductor stack and at least one of the first buffer layer and the plurality of spaces of the PIL layer.

The second buffer layer may be a compound semiconductor having one of a super lattice layer and an aluminium (Al) gradient distribution that varies according to a thickness of the second buffer layer.

The HEMT stack may include a semiconductor stack that extends laterally over the plurality of pillars and the plurality of empty spaces of the PIL layer; a gate on a first region of an upper surface of the semiconductor stack, a source electrode a second region of the upper surface of the semiconductor stack, and a drain electrode on a third region of the upper surface of the semiconductor stack. The source electrode, the drain electrode, and the gate may be spaced apart from each other.

The source electrode and the gate may expose a fourth region of the upper surface of the semiconductor stack disposed between the second region and the first region of the upper surface of the semiconductor stack. The gate and the drain electrode may expose a fifth region of the upper surface of the semiconductor stack disposed between the first region and the third region of the semiconductor stack. A width of the fourth region of the upper surface of the semiconductor stack may be less than or equal to a width of the fifth region of the upper surface of the semiconductor stack.

The plurality of pillars of the PIL layer may include a first pillar, a second pillar, and a middle pillar arranged apart from each other. The first pillar of the PIL layer may be under at least a part of at least one of the second region and the fourth region of the upper surface of the semiconductor stack. The second pillar of the PIL layer may be under at least a part of at least one of the third region and the fifth region of the upper surface of the semiconductor stack. The middle pillar of the PIL layer may be between the first pillar and the second pillar.

A width of the first pillar of the PIL layer may be about equal to a width of at least one of the middle pillar and the second pillar of the PIL layer.

A width of the first pillar of the PIL layer may be greater than a width of at least one of the middle pillar and the second pillar of the PIL layer.

A width of the middle pillar of the PIL layer may be different than a width of at least one of the first pillar and the second pillar of the PIL layer.

The PIL layer may define a plurality of empty spaces. The HEMT stack may include a first buffer layer on the PIL layer. The first buffer layer may define a plurality of through-holes and each of the plurality of through-holes of the first buffer layer may overlay one of the plurality of empty spaces defined by the PIL layer.

A width of the middle pillar of the PIL layer may be greater than a width of the intermediate portion of at least one of the plurality of empty spaces defined by the PIL layer.

A width of the middle pillar of the PIL layer may be less than a width of the intermediate portion of one of the at least one of the plurality of empty spaces defined the PIL layer.

A width of the first pillar of the PIL layer may be greater than a width of the intermediate portion of one of the at least one of the plurality of empty spaces defined the PIL layer.

According to example embodiments, a method of manufacturing a high electron mobility transistor (HEMT) includes forming a pseudo-insulation layer on a substrate and forming a HEMT stack on the PIL layer. The PIL layer includes a plurality of pillars that are arranged apart from each other on the substrate. The PIL layer defines a plurality of empty spaces between the plurality of pillars. The plurality of empty spaces are each wider at an intermediate portion than a top of the empty spaces.

BRIEF DESCRIPTION OF THE DRAWINGS

The foregoing and other features and advantages of example embodiments will become apparent and more readily appreciated from the following description of non-limiting embodiments, taken in conjunction with the accompanying drawings of which.

DETAILED DESCRIPTION

Figure 1:
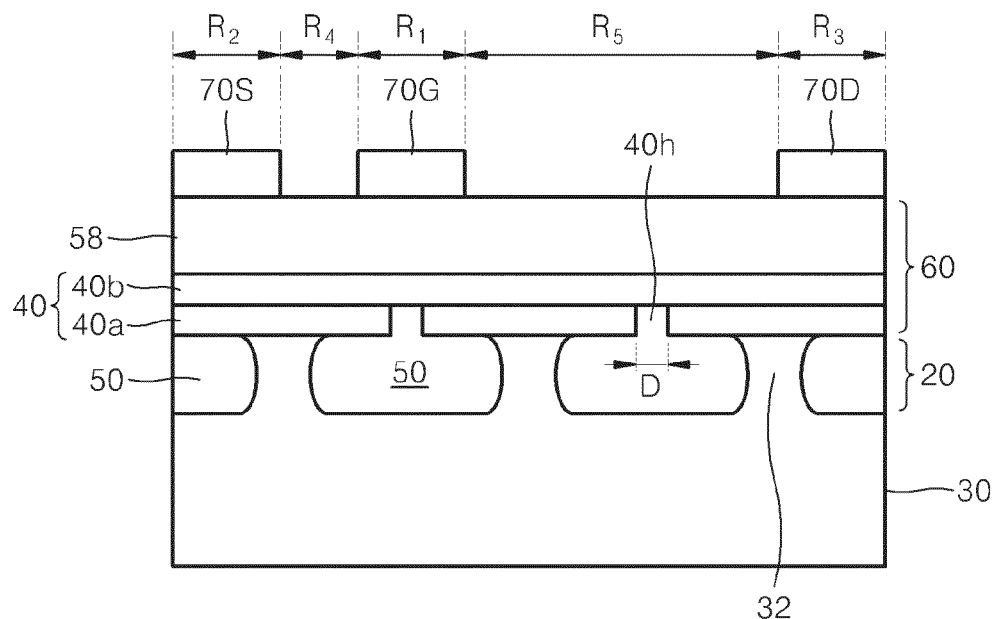
FIG. 1 is a cross-sectional view showing a high electron mobility transistor (HEMT), according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise.

It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a cross-sectional view showing a high electron mobility transistor (HEMT), according to example embodiments.

Referring to FIG. 1, a substrate 30, a pseudo-insulation layer (PIL) layer 20, a buffer layer 40, and a semiconductor stack 58 are sequentially stacked. The semiconductor stack 58 may include a plurality of compound semiconductor layers. A source electrode 70S, a drain electrode 70D, and a gate 70G are disposed on the semiconductor stack 58. The source electrode 70S, the drain electrode 70D, and the gate (electrode) 70O are spaced apart from one another. The gate 70G is disposed between the source electrode 70S and the drain electrode 70D. The gate 70G is closer to the source electrode 70S than the drain electrode 70D. An upper surface of the semiconductor stack 58 includes a first region $R_1$, a second region $R_2$, a third region $R_3$, a fourth region $R_4$, and a fifth region $R_5$. The source electrode 70S may be on the second region $R_2$. The gate 70G may be on the first region $R_1$. The drain electrode may be on the third region $R_3$ of the upper surface of the semiconductor stack 58. A fourth region $R_4$ of the semiconductor stack may be between the first region $R_1$ and the second region $R_2$. A fifth region $R_5$ of the semiconductor stack 58 may be between the first region $R_1$ and the third region $R_3$ of the semiconductor stack 58.

The substrate 30 may be a material capable of being dry etched or wet etched, such as a silicon substrate, but example embodiments are not limited thereto. A surface direction of an upper surface of the silicon substrate may be (111). The buffer layer 40 may include a first buffer layer 40a and a second buffer layer 40b that are sequentially stacked. The buffer layer 40 may have a single-layered structure or a multi-layered structure including two or more layers. The first buffer layer 40a includes a plurality of through holes 40h. A diameter D1 of the through holes 40h may be in a range, for example, from about 10 nm to about 20 μm. The diameter D1 in FIG. 1 may be about 1 μm. The through holes 40h of the first buffer layer 40a are covered by the second buffer layer 40b.

While FIG. 1 illustrates a buffer layer 40a where the through holes 40h have the same (or substantially the same) diameter D1, example embodiments are not limited thereto. The diameter D1 of the through holes 40h may be varied according to a mask design used in a process for patterning the first buffer layer 40a.

A combination of the buffer layer 40 and the semiconductor stack 58 may be regarded as a single stack, that is, an HEMT stack 60. The HEMT stack 60 may include the source electrode 70S, the drain electrode 70D, and the gate 70G.

The PIL layer 20 is disposed between the buffer layer 40 and the substrate 30. The PIL layer 20 may be formed of a plurality of materials, for example two materials having phases different from each other. The phase of each material may be any one of a solid phase, a gaseous phase, a liquid phase, and a combination thereof. As shown in FIG. 1, the PIL layer 20 may include a plurality of pillars 32 that are formed of a solid material and are spaced apart from one another. The plurality of pillars 32 may connect the buffer layer 40 and the substrate 30 and support the buffer layer 40. That is, the pillars 32 support the HEMT stack 60 including the buffer layer 40 and the source electrode 70S, the drain electrode 70D, and the gate 70G disposed on the buffer layer 40. Empty spaces 50 are formed between the pillars 32. Gaseous materials, for example, a gas or air, may be filled into the empty spaces 50. The pillars 32 formed of a solid material may be a part of the substrate 30. The pillars 32 may be single crystal pillars, such as single crystal silicon pillars.

As shown in FIG. 1, when the pillars 32 of the PIL layer 20 are formed as a part of the substrate 30, the PIL layer 20, including the pillars 32 and the empty spaces 50, and the substrate 30 together may be referred to as a substrate. Accordingly, the substrate 30 may be regarded as including the pillars 32 and the empty spaces 50 of the PIL layer 20.

The pillars 32 are spaced apart from one another, and intervals between the pillars 32 may be regular or irregular. Each of the pillars 32 may be disposed to correspond to a portion of the buffer layer 40 formed between the through holes 40h. Each of the pillars 32 contacts a part of a lower surface of the buffer layer 40. The through holes 40h may be inlets of the empty spaces 50. The semiconductor stack 58 is formed on the buffer layer 40 through an epitaxial method.

Figure 2:
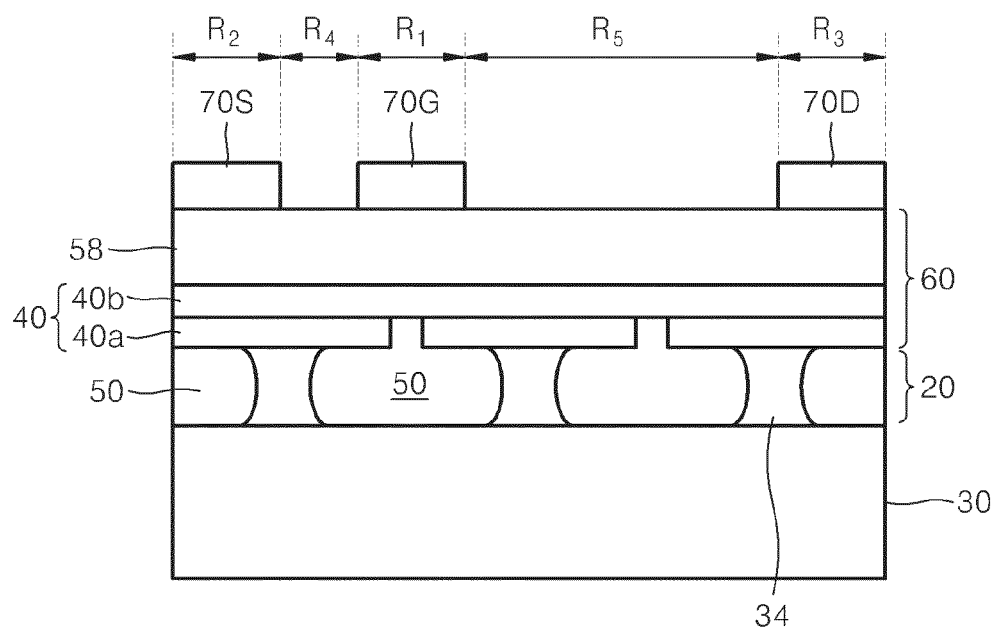
FIG. 2 is a cross-sectional view showing an HEMT having an oxide pillar instead of a pillar of the HEMT of FIG. 1.

FIG. 2 is a cross-sectional view showing an HEMT, according to example embodiments. In FIG. 2, the PIL layer 20 includes a plurality of oxide pillars 34 instead of the pillars 32 shown in FIG. 1. The oxide pillars 34 may be, for example, silicon oxide pillars. The oxide pillars 34 of FIG. 2 may be formed from the pillars 32 of FIG. 1 through an oxidation process.

When the pillars 32 of the PIL layer 20 are disposed between the substrate 30 and the buffer layer 40 as shown in the HEMT of FIG. 1, a voltage applied between the source electrode 70S and the drain electrode 70D may be increased, and thus a critical field may be applied to the pillars 32. Accordingly, the pillars 32 may be damaged. If the pillars 32 are damaged, a path formed between the source electrode 70S and the drain electrode 70D through the substrate 30 is blocked, thereby limiting (and/or preventing) a current from leaking between the source electrode 70S and the drain electrode 70D through the substrate 30. As such, since a breakdown voltage of the HEMT shown in FIG. 1 is unaffected by the critical field applied to the substrate, the breakdown voltage of the HEMT shown in FIG. 1 may be greater than that of a conventional HEMT.

When the oxide pillars 34 of the PIL layer 20 are not damaged, and a current path in the horizontal direction is connected to lower portions of the oxide pillars 34 along the oxide pillars 34 since the oxide pillars 34 are spaced apart from one another in a horizontal direction. Accordingly, the whole current path is increased compared to the conventional HEMT in which the oxide pillars 34 are not formed, and thereby a breakdown voltage of the HEMT shown in FIG. 2 may be increased.

In particular, in the HEMT of FIG. 2, the buffer layer 40 and the substrate 30 are connected to each other through the oxide pillars 34. When the oxide pillars 34 are $SiO_2$ pillars, the breakdown voltage of the HEMT may be the breakdown voltage of the oxide pillars 34 which is the critical field value of $SiO_2$ pillars and is about 10 MV/cm. In this case, the breakdown voltage of the oxide (i.e. $SiO_2$) pillars 34 is about 30 times higher than that of the pillars 32 made of a silicon material and is about 3 times higher than that of a GaN material. Accordingly, even when a voltage applied between the source electrode 70S and the drain electrode 70D is increased, the oxide pillars 34 may not be damaged. Thus, the HEMT of FIG. 2 may maintain a higher breakdown voltage than a conventional HEMT and may be more stable structurally than the HEMT of FIG. 1.

Figure 3:
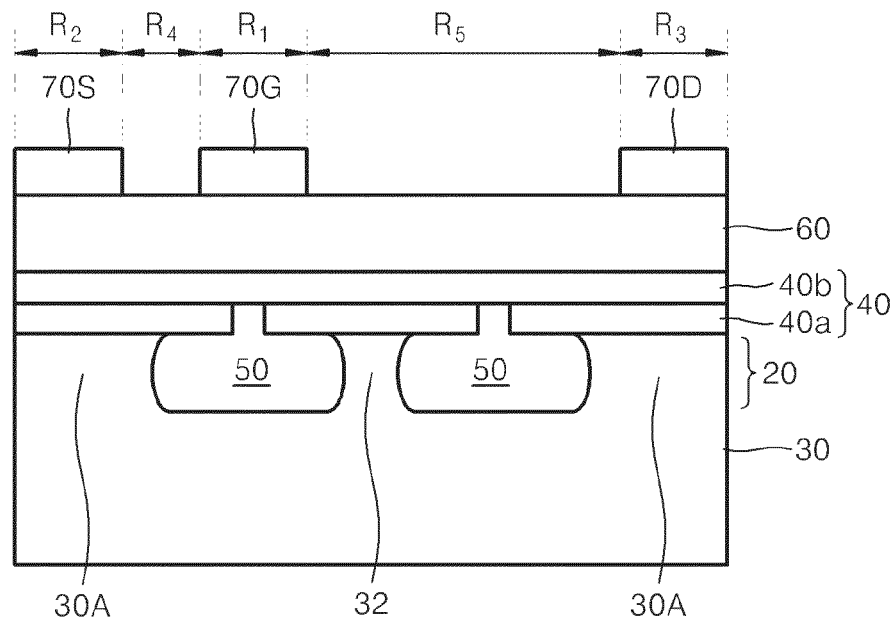
FIG. 3 is a cross-sectional view showing an HEMT, according to example embodiments.
Figure 4:
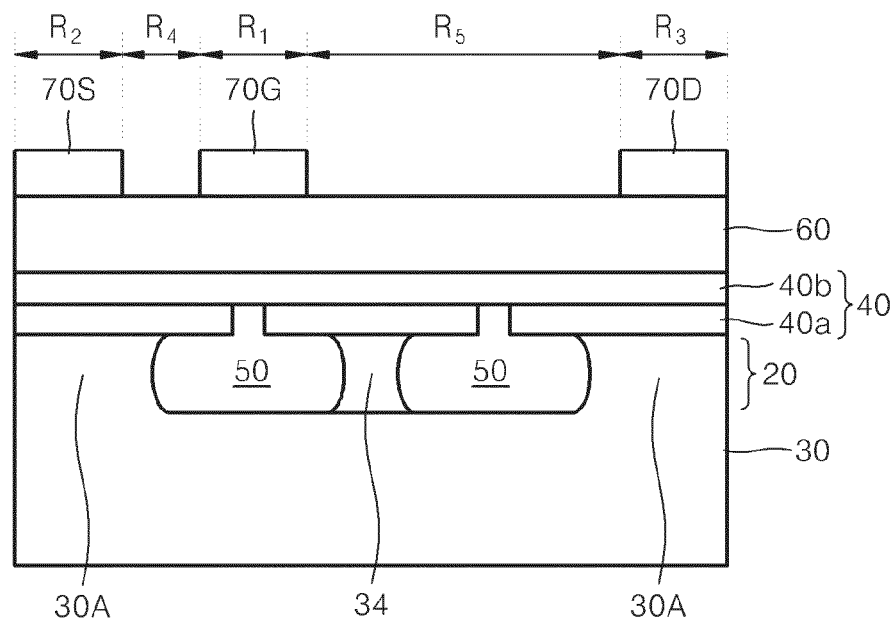
FIG. 4 is a cross-sectional view showing an HEMT having an oxide pillar instead of a pillar of the HEMT of FIG. 3.

FIG. 3 is a cross-sectional view showing an HEMT, according to example embodiments. In FIG. 3, the pillars 32 are not disposed below a source electrode 70S and a drain electrode 70D. In FIG. 3, the pillars 32 are disposed between the source electrode 70S and the drain electrode 70D. In FIG. 3, the buffer layer 40 disposed below the source electrode 70S and the drain electrode 70D is connected to the substrate 30 through the PIL layer 20. A plurality of first portions 30A contacting the buffer layer 40 and disposed in the PIL layer 20 below the source electrode 70S and the drain electrode 70D define an area where the pillars 32 and the empty spaces 50 are disposed. In other words, the pillars 32 and the empty spaces 50 are disposed between the first portions 30A. Although only one pillar 32 is disposed between the first portions 30A in FIG. 3, example embodiments are not limited thereto. Two or more pillars 32 may be disposed between the first portions 30A. The pillar 32 shown in FIG. 3 may be a silicon oxide pillar 34 as shown in FIG. 4.

Since the first portions 30A of the PIL layer 20 are disposed between the substrate 30 and the buffer layer 40, heat generated during operation of the HEMT may be easily discharged through the first portions 30A.

Figure 5:
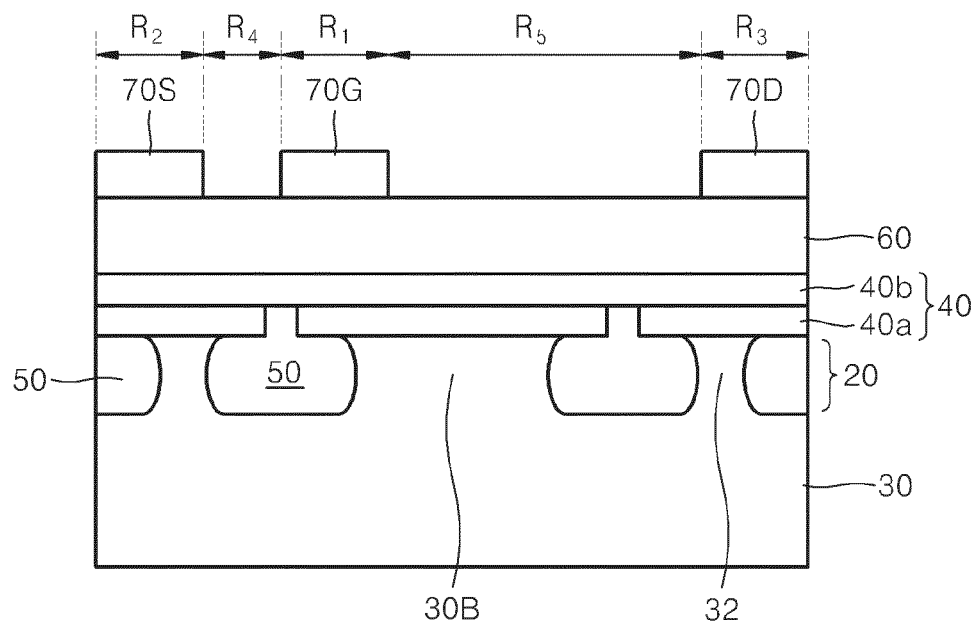
FIG. 5 is a cross-sectional view showing an HEMT, according to example embodiments.

FIG. 5 is a cross-sectional view showing an HEMT, according to example embodiments. In FIG. 5, the pillars 32 are disposed below the source electrode 70S and the drain electrode 70D. A second portion 30B of the PIL layer 20 is disposed between the source electrode 70S and the drain electrode 70D. The second portion 30B contacts the buffer layer 40 and is spaced apart from the source electrode 70S and the drain electrode 70D in the horizontal direction. The second portion 30B divides the pillars 32 and the empty spaces 50 disposed between the buffer layer 40 and the substrate 30 into two parts. That is, the pillars 32 and the empty spaces 50 are divided by the second portion 30B into a part adjacent to the source electrode 70S and another part adjacent to the drain electrode 70D. Two or more pillars 32 may be disposed adjacent to the source electrode 70S, and also, two or more pillars 32 may be disposed adjacent to the drain electrode 70D.

Figure 6:
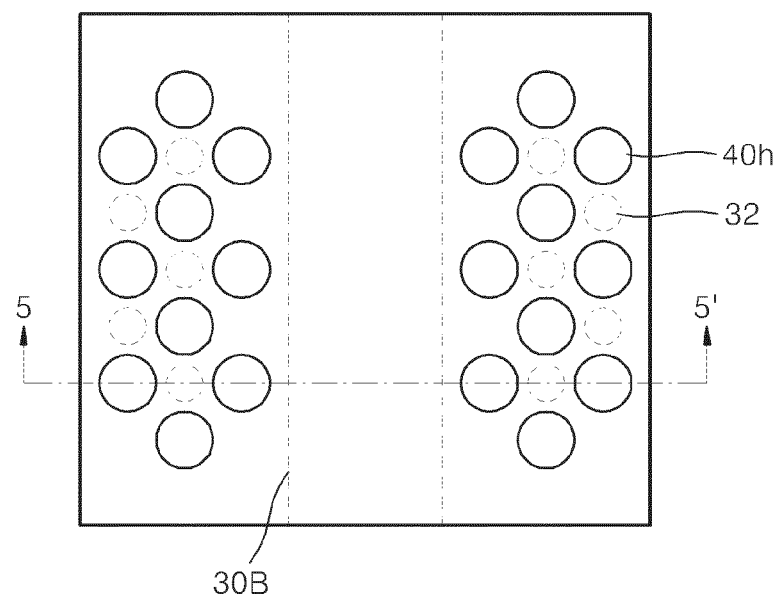
FIG. 6 is a plane view showing the HEMT of FIG. 5 in which a stack formed on a buffer layer is removed.

FIG. 6 is a plane view showing the HEMT of FIG. 5 in which the stack 58 formed on the buffer layer 40 is removed.

Relative locations between the pillars 32, the empty spaces 50 and the second portion 30B may be easily understood with reference to FIG. 6. Although the second portion 30B is illustrated as a single area in FIG. 6, there may be two or more second portions 30B spaced apart from each other. FIG. 5 is a cross-sectional view taken along a line 5-5' of FIG. 6.

Figure 7:
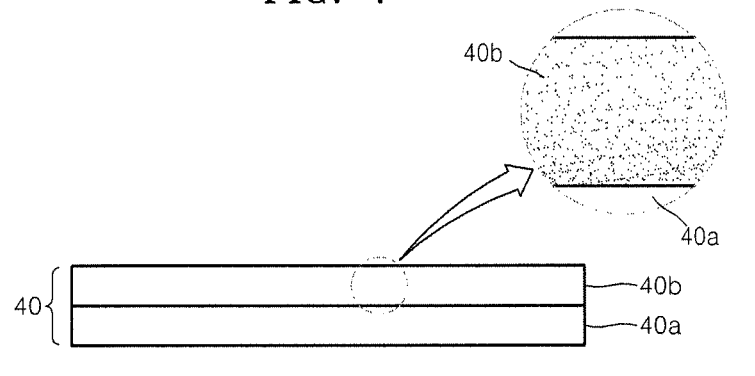
FIG. 7 is a cross-sectional view showing a structure of a buffer layer included in the HEMTs of FIGS. 1 through 6.

In the above-described HEMT, when the buffer layer 40 has a single-layered structure, the buffer layer 40 may be, for example, an AlN layer. FIG. 7 shows a structure of the buffer layer 40 when the buffer layer 40 has a multi-layered structure. Referring to FIG. 7, when the buffer layer 40 includes the first buffer layer 40a and the second buffer layer 40b sequentially stacked, the first buffer layer 40a may be, for example, an AlN layer. The second buffer layer 40b may be, for example, any one selected from the group consisting of an Al(Ga)N layer, an Al(Ga)N super lattice layer, and a g-AlGaN layer. In this regard, Al(Ga)N refers to AlN, AlGaN, or GaN. Also, the g-AlGaN layer refers to an AlGaN layer in which a concentration distribution of Al varies according to a thickness of the g-AlGaN layer. The buffer layer 40 may further include a third buffer layer 40c on the second buffer layer 40b. The third buffer layer 40c may be, for example, an Al(Ga)N layer.

Figure 8:
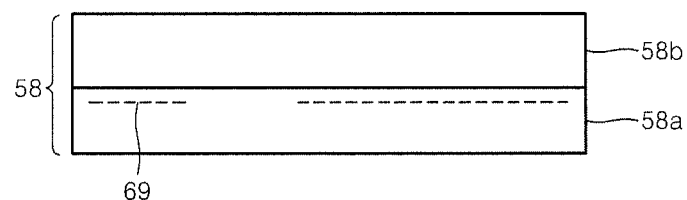
FIG. 8 is a cross-sectional view showing a structure of a stack of the HEMTs of FIGS. 1 through 6.

FIG. 8 shows a structure of the semiconductor stack 58.

Referring to FIG. 8, the semiconductor stack 58 includes a first stack 58a and a second stack 58b that are sequentially stacked. The first and second stacks 58a and 58b may be compound semiconductor layers having polarizations and band gaps different from each other. The first stack 58a may be, for example, a GaN layer. The second stack 58b may be, for example, an AlGaN layer having a polarization and a band gap that are respectively greater than those of the first stack 58a. A two-dimensional electron gas (2DEG) 69 is formed in the first stack 58a due to a difference between the polarizations of the first and second stacks 58a and 58b.

Next, a method of manufacturing an HEMT will be described with reference to FIGS. 9 through 24, according to example embodiments. Hereinafter, the same reference numerals as in FIGS. 1 through 8 denote the same components.

Figure 9:
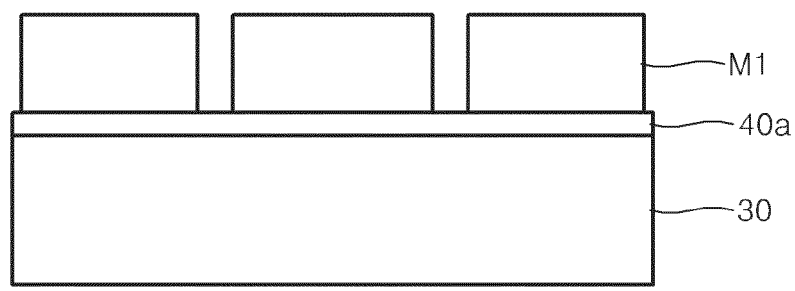
FIGS. 9 through 15 are cross-sectional views sequentially showing a method of manufacturing an HEMT according to example embodiments.

Referring to FIG. 9, the first buffer layer 40a is formed on the substrate 30. The first buffer layer 40a may be formed through an epitaxial method. A mask M1 is formed on the first buffer layer 40a. The mask M1 may be a photoresist mask or a hard mask. The hard mask may be, for example, a silicon oxide (e.g. $SiO_2$) mask or a silicon nitride (e.g. $SiN_x$) mask. Areas are exposed (defined) by the mask M1, and a plurality of contact holes are formed in the exposed areas of the first buffer layer 40a. The areas of the first buffer layer 40a exposed by the mask M1 may have a circular shape or a non-circular shape, such as a oval shape, or alternatively, may have a polygonal pattern, such as a triangular shape or any of various other shapes.

Figure 10:
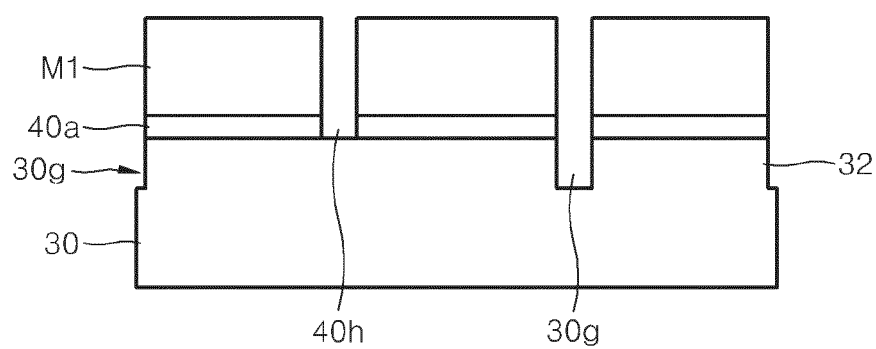

Next, as shown in FIG. 10, the areas of the first buffer layer 40a exposed by the mask M1 are etched until the substrate 30 is exposed, and exposed portions of the substrate 30 are etched to a desired (or alternatively predetermined) depth. Accordingly, the through holes 40h are formed in the first buffer layer 40a, and grooves 30g having desired (or alternatively predetermined) depths are formed in the substrate 30. The etching may be performed by using a dry etching method. The dry etching method may be, for example, a reactive ion etching method or any of various other etching methods. The pillars 32 of the PIL layer 20 are formed between the holes 40h by using the dry etching method. Intervals between the holes 40*h* may be set at a desired (or alternatively predetermined) distance such that the pillars 32 under the first buffer layer 40*a* are formed by the above etching methods. When the intervals between the holes 40*h* are excessively large, the pillars 32 may not be formed or an etching time may be excessively extended. When the first buffer layer 40*a* is etched, an etching temperature may be in a range of, for example, about 0 to about 80° C., an etching pressure may be in a range of, for example, about 1 to about 1,000 mTorr, and an etching power may be in a range of, for example, about 100 W to about 3,000 W. An etching gas may be any one selected from the group consisting of $Cl_2$, $BCl_3$, and Ar. Also, when the grooves 30*g* are formed in the substrate 30, an etching temperature may be in a range of, for example, about 0 to about 80° C., an etching pressure may be in a range of, for example, about 1 to about 10,000 mTorr, and an etching power may be in a range of, for example, about 100 W to about 6,000 W. An etching gas may be an $SF_6$.

In the dry etching, the depths of the grooves 30*g* formed in the substrate 30 may be in a range of, for example, about 0.01 μm to about 500 μm, but the depths of the grooves 30*g* may vary if necessary. Depths and volumes of empty spaces to be formed later between the substrate 30 and the first buffer layer 40*a* may vary according to the depths of the grooves 30*g* formed in the substrate 30. Thus, heights of the pillars 32 formed between the substrate 30 and the first buffer layer 40*a* may be determined.

Figure 11:
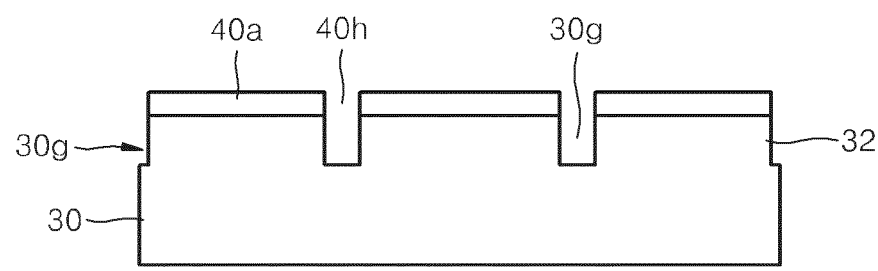

Next, after performing the dry etching, as shown in FIG. 11, the mask M1 is removed.

Figure 12:
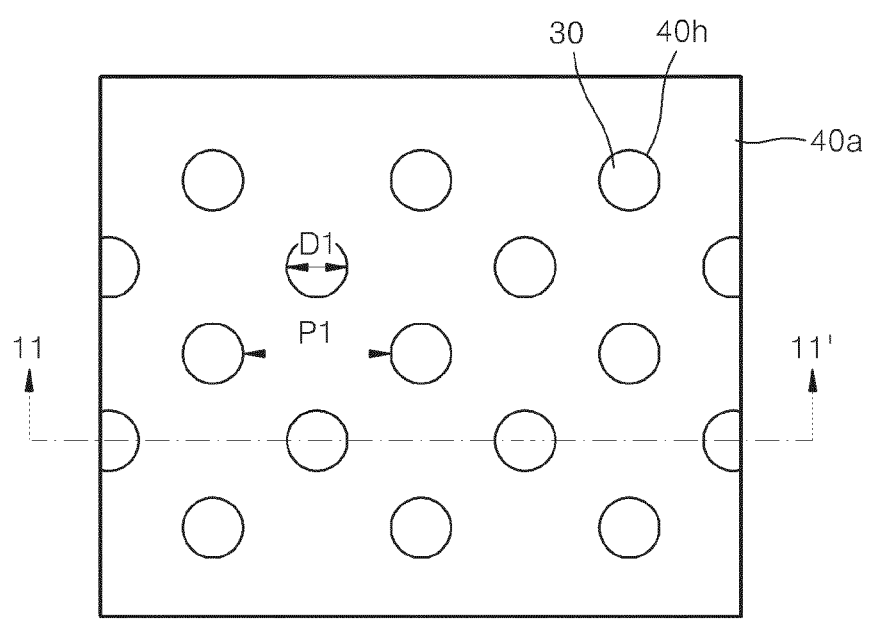

FIG. 12 is a top view showing the resultant structure in which the mask M1 is removed. FIG. 11 is a cross-sectional view taken along a line 11-11' of FIG. 12.

Referring to FIG. 12, the through holes 40*h* are formed in the buffer layer 40 to expose parts of the substrate 30. The through holes 40*h* form a lattice arrangement. In the lattice arrangement of the through holes 40*h*, a distance P1 between the through holes 40*h* may be in a range of, for example, about 0.01 to about 1,000 μm. The arrangement pattern of the through holes 40*h* is not limited to the lattice arrangement shown in FIG. 12, and thus the through holes 40*h* may form another polygonal lattice arrangement, for example, a tetragonal lattice arrangement or a triangular lattice arrangement.

Figure 13:
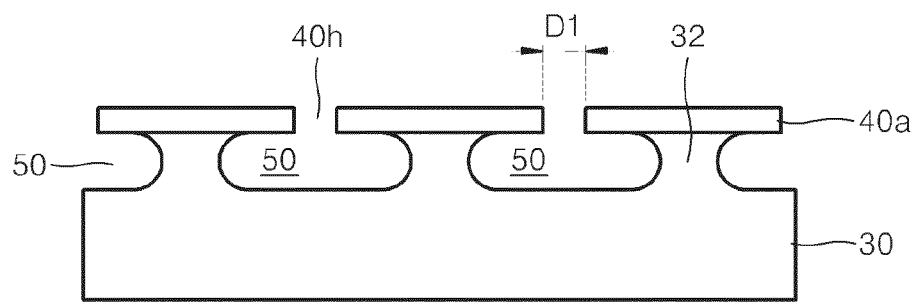

After conducting the dry etching, wet etching is performed on the exposed portions of the substrate 30. In this regard, the wet etching is isotropic etching and thus is performed laterally around the through holes 40*h*. Accordingly, undercuts are formed around the through holes 40*h* under the first buffer layer 40*a* due to the wet etching, and thereby diameters of the pillars 32 are reduced and the empty spaces 50 are formed around the pillars 32 as shown in FIG. 13. The empty spaces 50 are formed by laterally expanding the grooves 30*g* shown in FIG. 11 via the wet etching. The contact holes 40*h* may be inlets of the empty spaces 50. The empty spaces 50 may be filled with a gas, for example, air. The wet etching may be performed until a target (e.g., minimum) diameter of the pillar 32 reaches a desired (or alternatively predetermined) value. The wet etching may be performed at a temperature of about 10 to about 100° C. for about 1 second to about 5 hours, and an etchant including HNA ($HF:HNO_3:CH_3COOH=1:1:1$) and DI may be used. A ratio of HNA to DI may be in a range of about 0.001:1 to about 10:1.

Figure 14:
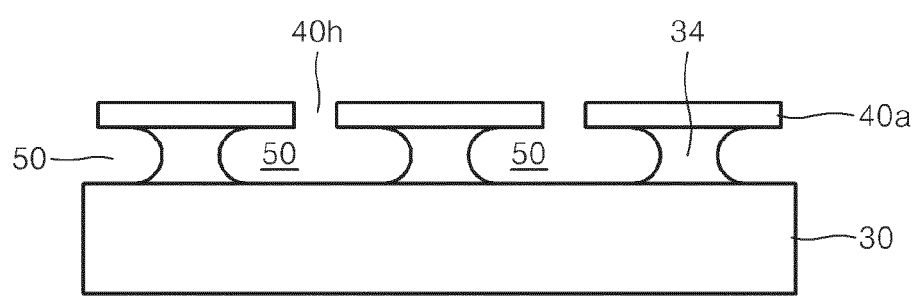

After finishing the wet etching process, the pillars 32 may be converted into the oxide pillars 34 as shown in FIG. 14. The oxide pillars 34 may be silicon oxide pillars. The oxide pillars 34 may be formed by thermally oxidizing the pillars 32. The thermal oxidization may be performed with respect to the resultant shown in FIG. 13. The thermal oxidization may be finished at a time when the pillars 32 are changed into the oxide pillars 34. A process of converting the pillars 32 into the oxide pillars 34 may be performed later, for example, before or after forming the source electrode 70S and the drain electrode 70D or before or after forming the gate 70G. The thermal oxidization may be performed in, for example, a furnace. The thermal oxidization may be performed, for example, at a temperature of about 500 to about 1,500° C. under a pressure of about 0.01 to about 760 Torr for about 0.1 to about 24 hours.

Figure 15:
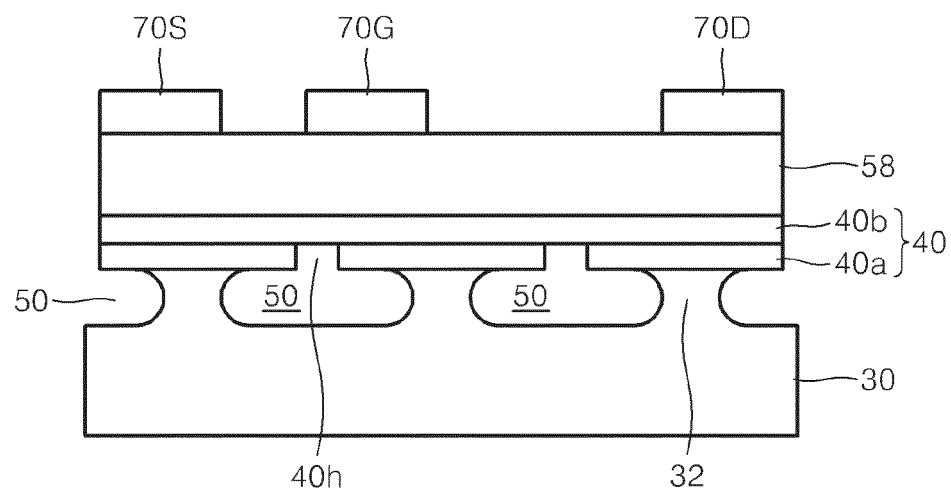

Referring to FIG. 15, the second buffer layer 40*b* is formed on the first buffer layer 40*a* so as to cover the through holes 40*h*, and the second buffer layer 40*b* may be formed by using an epitaxial method, thereby forming the buffer layer 40. The buffer layer 40 may be formed to have a multi-layered structure including two or more layers, and a third buffer layer (not shown) or more buffer layers may further be formed on the second buffer layer 40*b*. The semiconductor stack 58 is formed on the buffer layer 40. The semiconductor stack 58 may be formed by using, for example, an epitaxial method. The buffer layer 40 and the semiconductor stack 58 may constitute the HEMT stack 60. In order to form the HEMT stack 60, the resultant shown in FIG. 13 or FIG. 14 is loaded into, for example, a metalorganic chemical vapor deposition (MOCVD) apparatus to perform a process of forming the HEMT stack 60. In this regard, the second buffer layer 40*b* may be grown faster in a horizontal direction than in a vertical direction. Thus, the through holes 40*h* of the first buffer layer 40*a* are covered by and filled with the second buffer layer 40*b*.

Prior to forming the second buffer layer 40*b*, a nitride film (e.g., $SiN_x$, not shown) may be formed on the surface of the empty spaces 50 using $NH_3$ gas in a deposition process using MOCVD in order to limit the material of the second buffer layer 40*b* from forming on the surface of the empty spaces 50 when the second buffer layer 40*b* is formed.

After the semiconductor stack 58 is formed, the source electrode 70S, the drain electrode 70D, and the gate 70G are formed on the semiconductor stack 58. The source electrode 70S and the drain electrode 70D may be formed at the same time. The gate 70G may be formed before or after the source electrode 70S and the drain electrode 70D are formed.

Figure 16:
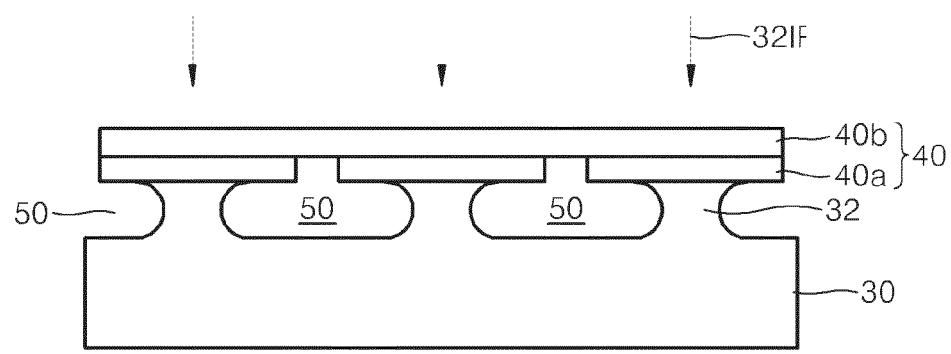
FIGS. 16 through 18 are cross-sectional views sequentially showing a method of manufacturing an HEMT according to example embodiments.
Figure 17:
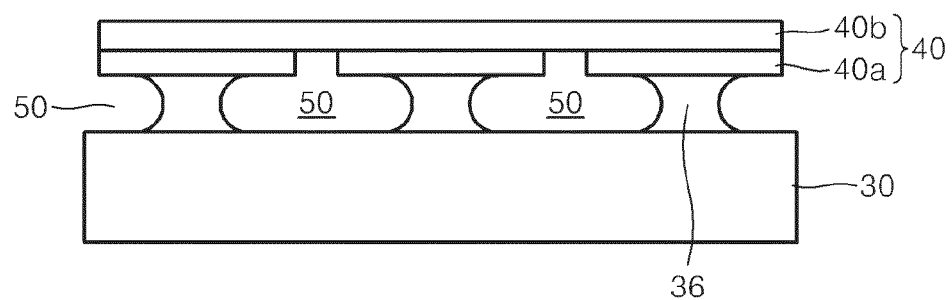

According to example embodiments, as shown in FIG. 16, after the pillars 32 are formed, an impurity 32IP is ion-implanted into the pillars 32. The impurity 32IP may be, for example, N, Ar, Fe, B, Mn, Ne, O, H, C, F, or Cl. Then, annealing may be performed thereon. Accordingly, the pillars 32 may be polysilicon pillars 36 as shown in FIG. 17. In FIG. 16, the second buffer layer 40*b* may be formed after the ion-implantation is performed.

Figure 18:
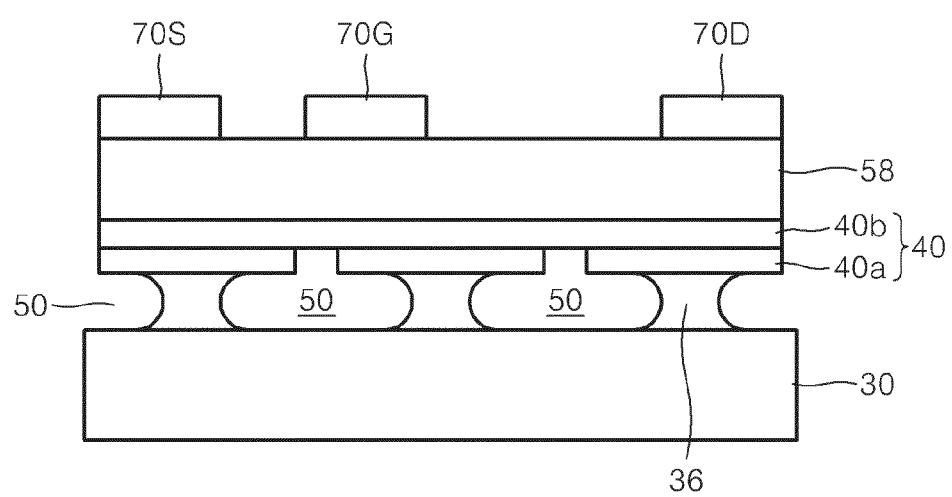

Referring to FIG. 18, after the polysilicon pillars 36 are formed, the semiconductor stack 58 may be formed on the buffer layer 40, and the source electrode 70S, the drain electrode 70D, and the gate 70G may be formed on the semiconductor stack 58.

Figure 19:
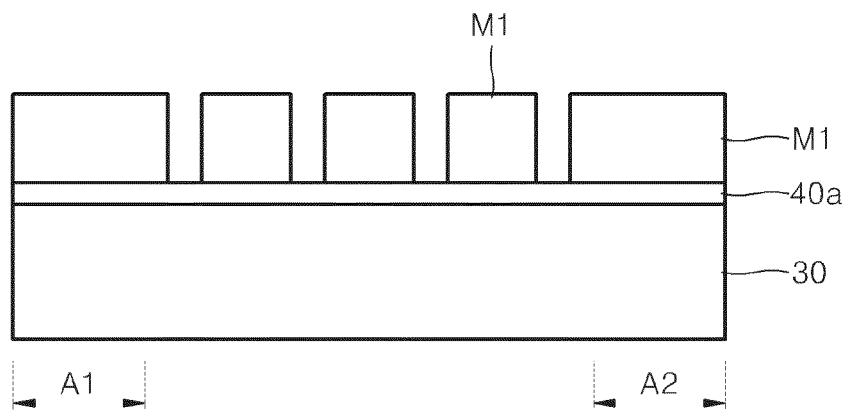
FIGS. 19 through 21 are cross-sectional views sequentially showing a method of manufacturing an HEMT according to example embodiments.

Next, according to example embodiments, as shown in FIG. 19, after the first buffer layer 40*a* is formed on the substrate 30, the mask M1 may be formed on the first buffer layer 40*a* so as to define a first area A1 where the source electrode 70S is to be formed, a second area A2 where the drain electrode 70D is to be formed, and an area where the through holes 40*h* are to be formed.

Figure 20:
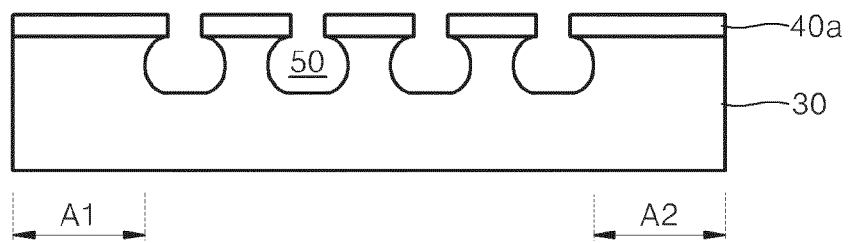

Then, the through holes 40*h* are formed in the first buffer layer 40*a* by using dry and wet etching methods as shown in FIG. 20, and the pillars 32 contacting the first buffer layer 40*a* are formed in the substrate 30, thereby forming the empty spaces 50 around the pillars 32. The through holes 40*h* and the empty spaces 50 are not formed in the first and second areas A1 and A2. The through holes 40h and the empty spaces 50 are formed between the first and second areas A1 and A2.

Figure 21:
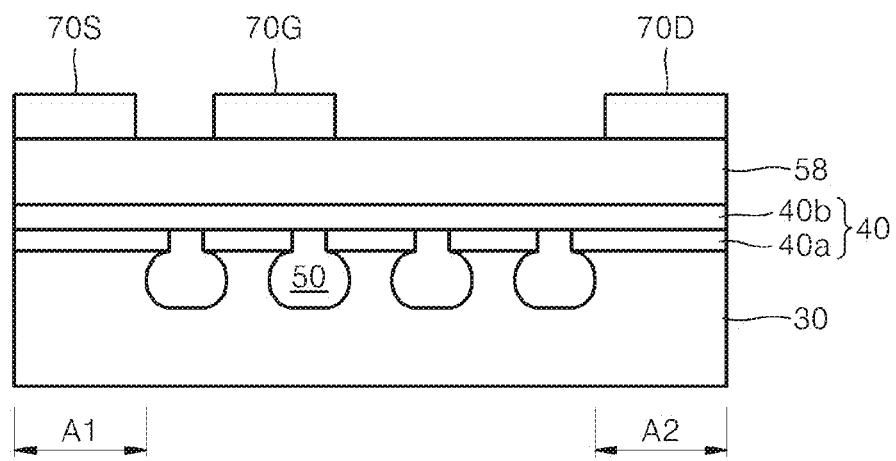

Then, referring to FIG. 21, the second buffer layer 40b is formed on the first buffer layer 40a so as to cover the through holes 40h. The semiconductor stack 58 is formed on the second buffer layer 40b. The source electrode 70S is formed on the semiconductor stack 58 so as to correspond to the first area A1, and the drain electrode 70D is formed on the semiconductor stack 58 so as to correspond to the second area A2. The gate 70G is formed on the semiconductor stack 58 between the first and second areas A1 and A2.

Figure 22:
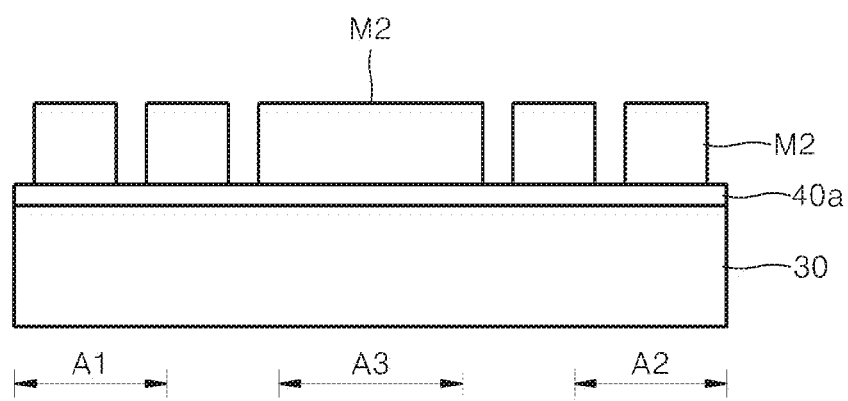
FIGS. 22 through 24 are cross-sectional views sequentially showing a method of manufacturing an HEMT according to example embodiments.
Figure 23:
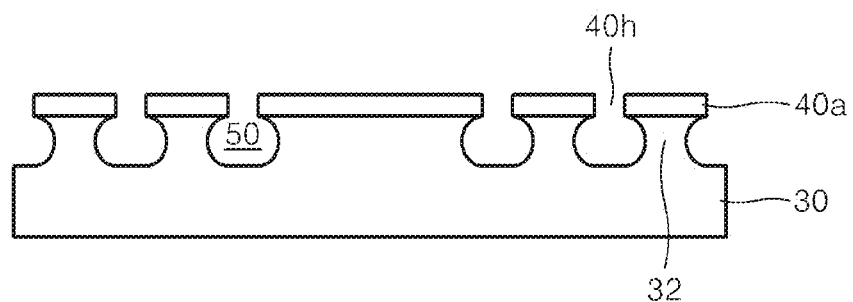
Figure 24:
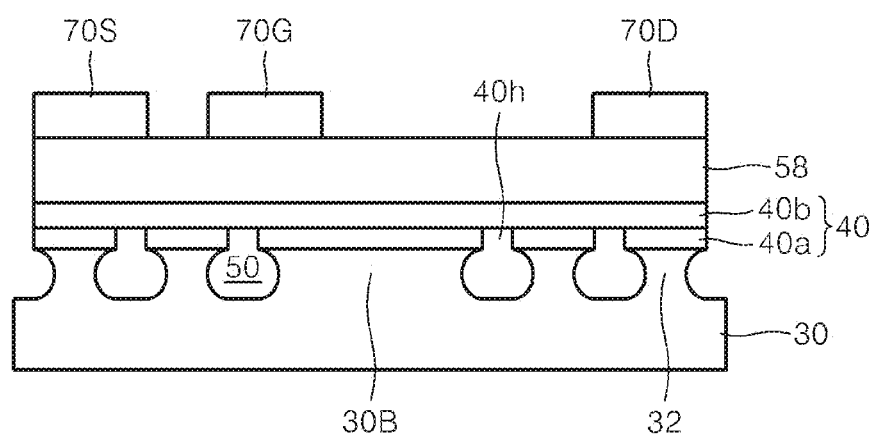

FIGS. 22 through 24 are cross-sectional views showing a method of manufacturing an HEMT, according to example embodiments.

Referring to FIG. 22, the first buffer layer 40a is formed on the substrate 30. A mask M2 is formed on the first buffer layer 40a so as to expose parts of the first buffer layer 40a. The mask M2 is formed to expose areas where the through holes 40h of the first buffer layer 40a are to be formed. Also, the mask M2 may be formed to cover an area of the first buffer layer 40a corresponding to a third area A3 of the substrate 30. The third area A3 is disposed between the first area A1 and the second area A2 and is spaced part from the first area A1 and the second area A2. In a subsequent process, the pillars 32 and the empty spaces 50 are formed in areas corresponding to opposite sides of the third area A3 but not in an area corresponding to the third area A3. Accordingly, the third area A3 may be a boundary area between an area including the pillars 32 and the empty spaces 50 formed below the source electrode 70S and another area including the pillars 32 and the empty spaces 50 formed below the drain electrode 70D. After the mask M2 is formed, the through holes 40h are formed in the first buffer layer 40a as shown in FIG. 23. A process of forming the pillars 32 and the empty spaces 50 may be the same as that described in the above embodiments.

Referring to FIG. 24, the second buffer layer 40b is formed on the first buffer layer 40a in which the through holes 40h are formed so as to cover the through hole 40h. The semiconductor stack 58 is formed on the second buffer layer 40b. Then, the source electrode 70S, the drain electrode 70D, and the gate 70G are formed on the semiconductor stack 58. The gate 70G may be formed either before or after the process to form the source electrode 70S and the drain electrode 70D.

In a method of manufacturing an HEMT according to example embodiments, the process of changing the pillars 32 into the oxide pillars 34 may be performed during the process of forming the semiconductor stack 58 or may be performed before or after forming the electrode to be finally formed from among the gate 70G, the source electrode 70S, and the drain electrode 70D.

Figure 25:
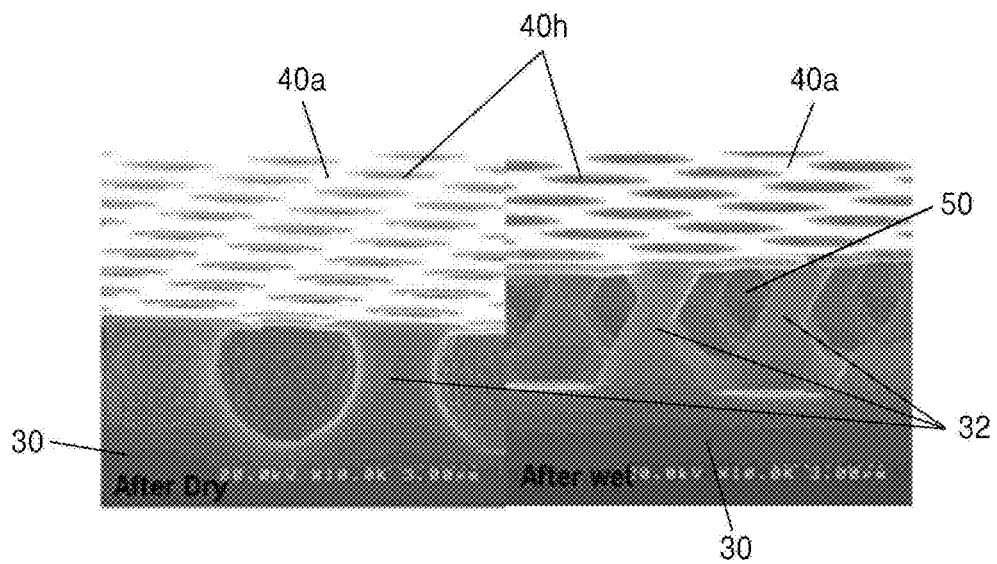
FIG. 25 is an scanning electron microscopy (SEM) image of a buffer layer and a substrate on which dry etching is performed and an SEM image of the substrate on which wet etching is additionally performed, according to example embodiments.

FIG. 25 shows scanning electron microscopy (SEM) images of the substrate 30 and the first buffer layer 40a after etching the substrate 30 during the manufacturing an HEMT according to example embodiments. In the left SEM image ("After Dry"), dry etching has been sequentially performed on the first buffer layer 40a and the substrate 30. In the right SEM image ("After Wet"), dry etching has been performed on the substrate 30 and the first buffer layer 40a, and then wet etching has been performed on the substrate 30.

Referring to FIG. 25, in the left SEM image, the pillars 32 connecting the substrate 30 and the first buffer layer 40a are formed between the substrate 30 and the first buffer layer 40a on which the dry etching has been performed. The pillars 32 shown in the right SEM image are thinner than that the pillars 32 shown in the left SEM image. In the right SEM image, the empty spaces 50 are formed between the pillars 32

Figure 26:
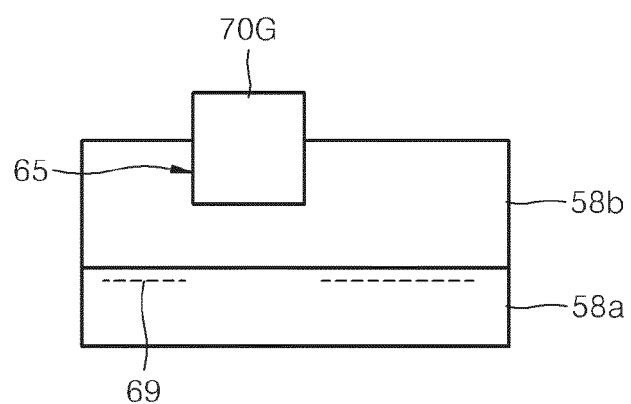
FIG. 26 is a cross-sectional view showing an HEMT in which a gate is formed in a recess formed in a channel supply layer (a first stack), according to example embodiments.
Figure 27:
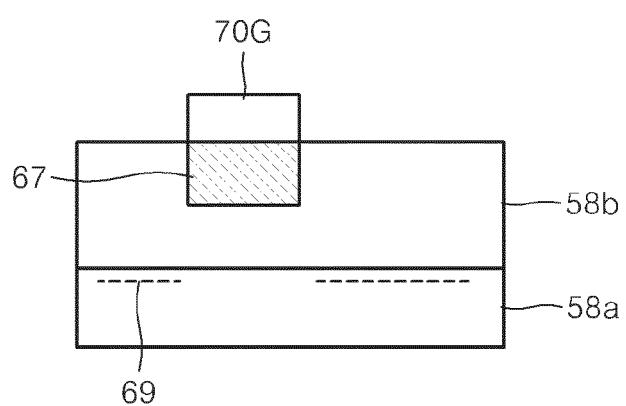
FIG. 27 is a cross-sectional view showing an HEMT in which an oxidized area is formed in a channel supply layer (a first stack) and in which a gate is formed on the oxidized area, according to example embodiments.

Meanwhile, in a HEMT according to example embodiments, when the gate 700 is formed on the semiconductor stack 58, a recess 65 may be formed where the gate 70G of the second stack 58b is to be formed before the gate 70G is formed on the second stack 58b as shown in FIG. 26. The gate 70G may be formed to fill the recess 65. Also, as shown in FIG. 27, after an oxidized area 67 is formed in an area corresponding to the gate 70G of the second stack 58b, the gate 70G may be formed on the oxidized area 67. The oxidized area 67 may be an area oxidized by using, for example, oxygen plasma. The 2DEG 69 formed below the recess 65 and the oxidized area 67 may be depleted in the first stack 58a including the 2DEG 69. Accordingly, the HEMT may be operated in an enhancement-mode (E-mode). Instead of forming the recess 65 and the oxidized area 67, even when the gate 70G is formed of a p-metal gate or a nitride gate, the HEMT may be operated in an E-mode.

Figure 28:
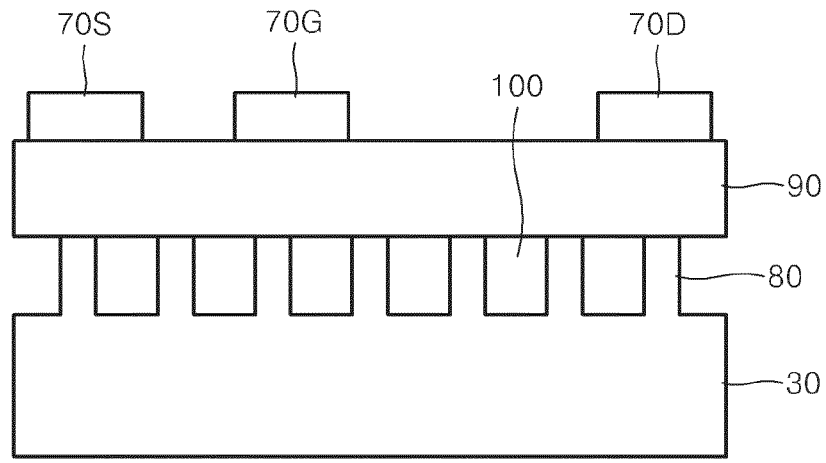
FIG. 28 is a cross-sectional view schematically showing a structure of the HEMT of FIG. 1.
Figure 29:
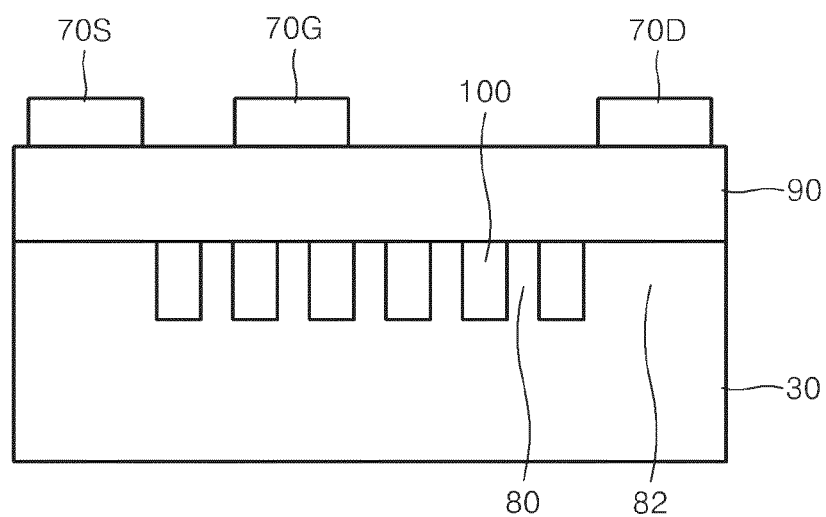
FIG. 29 is a cross-sectional view schematically showing a structure of the HEMT of FIG. 3.
Figure 30:
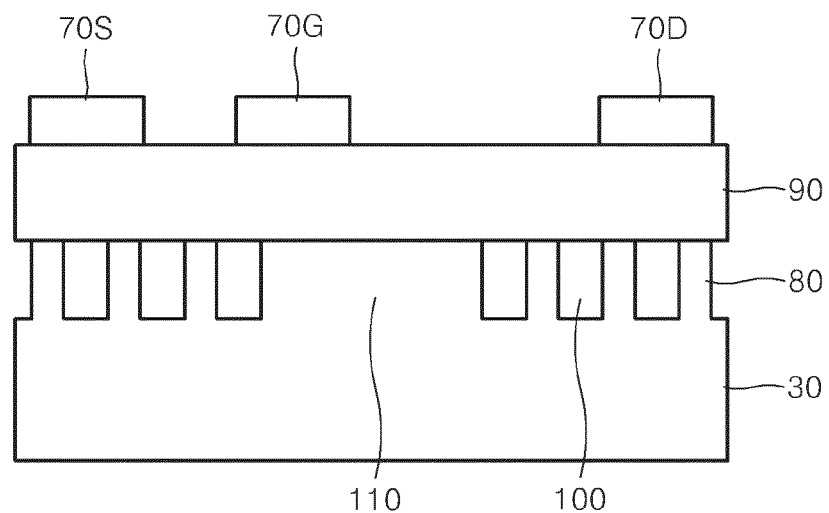
FIG. 30 is a cross-sectional view schematically showing a structure of the HEMT of FIG. 5.

FIGS. 28 through 30 are cross-sectional views schematically showing the structure of the HEMT according to example embodiments.

FIG. 28 is a cross-sectional view schematically showing a structure of the HEMT of FIG. 1. In FIG. 28, a plurality of vertical bar pillars 80 formed between the substrate 30 and an upper stack 90 corresponds to the pillars 32 of the PIL layer 20 described in FIG. 1. A plurality of empty spaces 100 formed between the vertical bar pillars 80 correspond to the empty spaces 50 formed between the pillars 32. The upper stack 90 corresponds to the HEMT stack 60 including the buffer layer 40 and the semiconductor stack 58. The vertical bar pillars 80 may be oxide pillars.

FIG. 29 is a cross-sectional view schematically showing a structure of the HEMT of FIG. 3. A partial area 82 of the substrate 30 disposed below the source electrode 70S and the drain electrode 70D does not include the vertical bar pillars 80 and the empty spaces 100, and corresponds to the first portion 30A of FIG. 3.

FIG. 30 is a cross-sectional view schematically showing a structure of the HEMT of FIG. 5. A partial area 110 of the PIL layer 20 formed below the gate 70G corresponds to the second portion 30B of FIG. 5.

Figure 31:
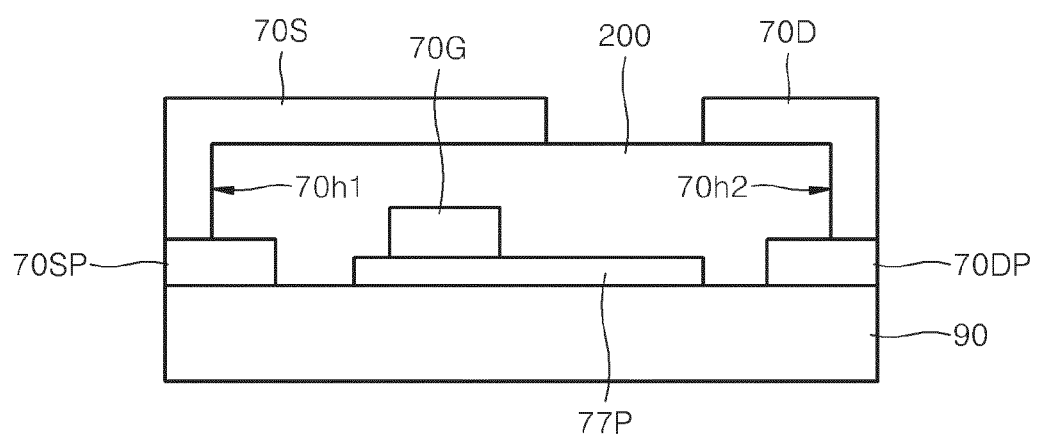
FIG. 31 is a cross-sectional view showing a structure formed on an upper stack of FIGS. 28 through 30.

FIG. 31 is a cross-sectional view showing a structure formed on the upper stack 90 of FIGS. 28 through 30. Accordingly, FIG. 31 shows only the upper stack 90 and components formed on the upper stack 90. A structure formed under the upper stack 90 may be the same as any of those shown in FIGS. 28 through 30.

Referring to FIG. 31, a source electrode pad 70SP and a drain electrode pad 70DP are formed on the upper stack 90. The source electrode pad 70SP and the drain electrode pad 70DP are spaced apart from each other. A P-type material layer 77P is disposed on the upper stack 90 to correspond to an area between the source electrode pad 70SP and the drain electrode pad 70DP. The P-type material layer 77P includes a P-type dopant. Thus, a 2DEG disposed below the P-type material layer 77P may be depleted. The gate 70G is formed on the P-type material layer 77P. The source electrode pad 70SP, the drain electrode pad 70DP, the P-type material layer 77P, and the gate 70G are covered by an insulating layer 200. The insulating layer 200 may be, for example, a silicon oxide layer. A first contact hole 70h1 for exposing the source electrode pad 70SP and a second contact hole 70h2 for exposing the drain electrode pad 70DP are formed in the insulating layer 200. The source electrode 70S fills the first contact hole 70h1 and the drain electrode 70D fills the second contact hole 70h2 and both are disposed on the insulating layer 200. The source electrode 70S and the drain electrode 70D are spaced apart from each other on the insulating layer 200, and the source electrode 70S may be disposed to cover the gate 70G.

In a process of forming the resultant shown in FIG. 31, the source electrode pad 70SP and the drain electrode pad 70DP are formed on the upper stack 90, and the P-type material layer 77P is formed between the source electrode pad 70SP and the drain electrode pad 70DP. However, an order of the processes may vary. For example, after the gate 70G is formed on the P-type material layer 77P, the insulating layer 200 covering the source electrode pad 70SP, the drain electrode pad 70DP, the P-type material layer 77P, and the gate 70G may be formed. Then, the source electrode 70S connected to the source electrode 70S via the first contact hole 70h1 and the drain electrode 70D connected to the drain electrode pad 70DP via the second contact hole 70h2 may be formed on the insulating layer 200.

Figure 32A:
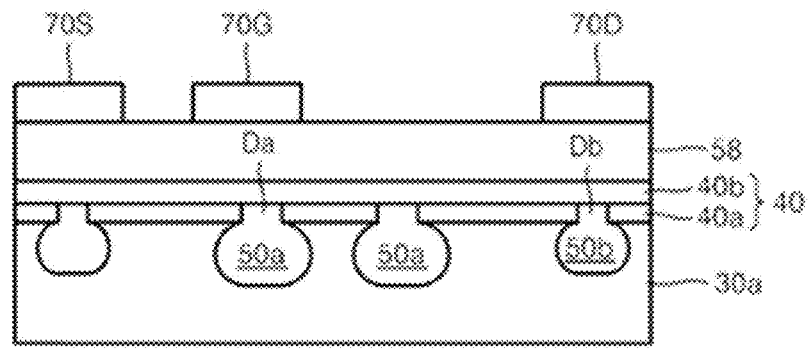
FIGS. 32A to 32C are cross-sectional views showing HEMTs according to example embodiments.
Figure 32B:
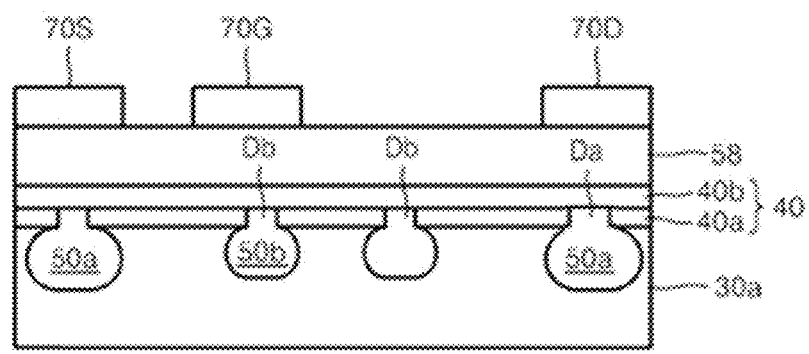
Figure 32C:
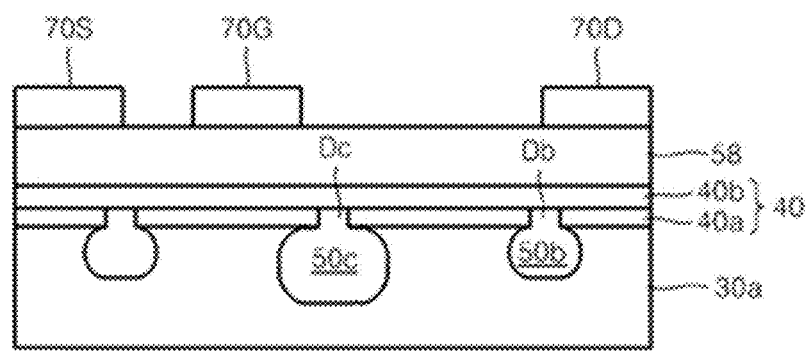

FIGS. 32A to 32C are cross-sectional views showing HEMTs according to example embodiments.

According to example embodiments, the size of the empty spaces may vary throughout a pseudo-insulation layer by varying a diameter of the through hole 40h of the first buffer layer 40a. Different masks can be designed for a stepper or scanner to transfer a pattern having variations in diameter for the through hole 40h to the first buffer layer 40a.

Referring to FIG. 32A, according to example embodiments, a HEMT may have a pseudo-insulation layer that has some empty spaces 50a that are wider than other empty spaces 50b. The wider empty spaces 50a may be etched through holes Da that are wider than the through holes Db of the narrower empty spaces 50b. While FIG. 32A illustrates a wider empty space 50a that is under the gate 70G and narrower empty spaces 50b are under the source 70S and drain 70D electrodes, example embodiments are not limited thereto.

Alternatively, referring to FIG. 32B, a HEMT according to example embodiments may include wider empty spaces 50a under the source 70S and drain electrodes 70D and narrower empty spaces 50b between the wider empty spaces 50a. The relative size of the empty spaces 50a and 50b in the HEMTs shown in FIGS. 32A and 32B may be targeted by adjusting the diameters Da and Db of the through holes in the first buffer layer 40a before the empty spaces 50a and 50b are formed.

Referring to FIG. 32C, a HEMT according to example embodiments may include an empty space 50c that is wider and deeper in depth compared to other empty spaces 50b. As shown in FIG. 32C, the first buffer layer 40a includes a through hole having a diameter Dc that corresponds to the empty space 50c.

It should be understood that example embodiments described therein should be considered in a descriptive sense only and not for purposes of limitation. Descriptions of features or aspects within some example embodiments should typically be considered as available for other similar features or aspects in other example embodiments.

While some example embodiments have been particularly shown and described, it will be understood by one of ordinary skill in the art that variations in form and detail may be made therein without departing from the spirit and scope of the claims.

What is claimed is:

1. A method of manufacturing a high electron mobility transistor (HEMT), the method comprising:
   forming a first part of an HEMT stack on a substrate;
   forming a pseudo-insulation layer (PIL) layer in the substrate,
      the PIL layer including at least two materials having different phases,
      the PIL layer defining an empty space that is wider at an intermediate portion than at an entrance of the empty space; and
   forming a second part of the HEMT stack on the first part of the HEMT stack.

2. The method of claim 1, wherein the forming the PIL layer in the substrate comprises:
   forming a plurality of holes in the first part of the HEMT stack to expose the substrate; and
   etching parts of the substrate exposed by the plurality of holes of the first part of the HEMT stack.

3. The method of claim 2, wherein the etching parts of the substrate exposed by the plurality of holes is performed until a plurality of pillars spaced apart from one another are formed in the PIL layer.

4. The method of claim 3, further comprising:
   changing the plurality pillars into a plurality of polysilicon pillars.

5. The method of claim 4, wherein the changing the plurality of pillars into polysilicon pillars comprises ion-implanting impurities into the plurality of pillars.

6. The method of claim 5, further comprising:
   oxidizing the plurality of pillars into which the impurities are implanted.

7. The method of claim 6, wherein the oxidizing the plurality of pillars into which the impurities are implanted further includes one of oxidizing the plurality pillars before forming the second part of the HEMT stack, oxidizing the plurality of pillars after forming the second part of the HEMT stack, and oxidizing the plurality of pillars during the forming the second part of the HEMT stack.

8. The method of claim 3, wherein the forming of the plurality of holes in the first part of the HEMT stack further comprises:
   forming a mask for defining areas where the plurality of holes are to be formed in the first part of the HEMT stack,
      the mask being formed to contact the first part of the HEMT stack and to cover a part of the substrate not including the pillars; and
   etching a portion of the first part of the HEMT stack around the mask.

9. The method of claim 8, wherein the part of the substrate is below a source electrode and a drain electrode.

10. The method of claim 8, wherein the part of the substrate is between a source electrode and a drain electrode.

11. The method of claim 2, wherein
   the at least two materials having different phases comprise a non-solid material, and
   the non-solid material contacts the first part of the HEMT stack and a part of the substrate.

12. The method of claim 2, wherein the etching parts of the substrate exposed by the plurality of holes comprises:
   forming grooves in the parts of the substrate exposed by the plurality of holes; and
   expanding the grooves so as to have a diameter greater than that of the plurality of holes until the plurality of pillars spaced apart from one another are formed in the PIL layer.

13. The method of claim 12, wherein the forming grooves in the substrate further includes dry-etching the parts of the substrate exposed by the holes.

14. The method of claim 12, wherein the expanding of the grooves further comprises wet-etching the substrate in which the grooves are formed.

15. The method of claim 12, wherein the plurality of pillars of the PIL layer are one of oxidized before the forming the second part of the HEMT stack, oxidized after the forming the second part of the HEMT stack, and oxidized during the forming the second part of the HEMT stack.

16. The method of claim 2, wherein the forming the second part of the HEMT stack comprises:
   forming a buffer layer covering the plurality of holes of the first part of the HEMT stack;
   forming a first stack comprising a 2DEG on the buffer layer;
   forming a second stack having a polarization greater than that of the first stack on the first stack; and
   forming a source electrode, a drain electrode, and a gate on the second stack,
      the source electrode, drain electrode, and gate being spaced apart from one another.

17. The method of claim 16, wherein one of a recess and an oxide is formed in an area below the gate of the second stack.

18. The method of claim 16, wherein the buffer layer covering the plurality of holes of the first part of the HEMT stack includes a compound semiconductor layer having an aluminum (Al) gradient distribution.

19. The method of claim 16, wherein the buffer layer covering the plurality of holes of the first part of the HEMT stack is a super lattice layer.

20. The method of claim 16, wherein the forming the source electrode, the drain electrode, and the gate comprises:
   forming a source electrode pad and a drain electrode pad spaced apart from each other on the second stack;
   forming a P-type material layer spaced apart from the source electrode pad and the drain electrode pad on the second stack between the source electrode pad and the drain electrode pad;
   forming the gate on the P-type material layer;
   forming an insulating layer covering the source electrode pad, the drain electrode pad, the P-type material layer, and the gate on the second stack; and
   forming the source electrode and the drain electrode respectively connected to the source electrode pad and the drain electrode pad.

21. The method of claim 1, wherein the at least two materials having different phases comprise a solid material and a non-solid material.

22. The method of claim 21, wherein
   the solid material is a semiconductor material, and
   the non-solid material is air.

23. The method of claim 21, wherein the solid material is an oxide.

24. The method of claim 21, wherein the oxide is one of oxides formed before forming the second part of the HEMT stack, formed after forming the second part of the HEMT stack, and formed during the forming the second part of the HEMT stack.

25. The method of claim 1, wherein the first part of the HEMT stack is a first buffer layer.

26. A method of manufacturing a high electron mobility transistor (HEMT), the method comprising:
   forming a pseudo-insulation layer (PIL) on a substrate,
      the PIL layer including a plurality of pillars that arranged apart from each other on the substrate,
      the PIL layer defining a plurality of empty spaces between the plurality of pillars,
      the plurality of empty spaces each being wider at an intermediate portion than at a top of the empty spaces; and
   forming a HEMT stack on the PIL layer.

* * * * *